United States Patent
Su

(10) Patent No.: US 7,701,056 B2
(45) Date of Patent: Apr. 20, 2010

(54) REDISTRIBUTION CONNECTING STRUCTURE OF SOLDER BALLS

(75) Inventor: Yi-Hsuan Su, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 213 days.

(21) Appl. No.: 11/610,486

(22) Filed: Dec. 13, 2006

(65) Prior Publication Data

US 2007/0200239 A1 Aug. 30, 2007

(30) Foreign Application Priority Data

Feb. 27, 2006 (TW) .............................. 95106582 A

(51) Int. Cl.
*H01L 23/48* (2006.01)

(52) U.S. Cl. .................. 257/737; 257/738; 257/778; 257/780; 257/E21.499; 257/E21.508; 438/612; 438/613; 438/614; 438/108

(58) Field of Classification Search .......... 257/E21.508, 257/E21.582, 698, 700, 751, 760, 678, 737–738, 257/778, 780, E21.499; 438/106, 107, 125, 438/128, 611, 612–617, 108, 597
See application file for complete search history.

(56) References Cited

U.S. PATENT DOCUMENTS

| | | | |
|---|---|---|---|
| 6,455,408 B1 * | 9/2002 | Hwang et al. | 438/613 |
| 6,521,970 B1 * | 2/2003 | Takiar et al. | 257/522 |
| 6,551,856 B1 * | 4/2003 | Lee | 438/108 |
| 6,750,547 B2 * | 6/2004 | Jeung et al. | 257/778 |
| 7,012,334 B2 | 3/2006 | Liu et al. | |
| 7,091,121 B2 | 8/2006 | Horng | |
| 2002/0093107 A1 * | 7/2002 | Wu et al. | 257/780 |
| 2006/0246703 A1 * | 11/2006 | Daubenspeck et al. | 438/612 |

* cited by examiner

*Primary Examiner*—A. Sefer
*Assistant Examiner*—Ermias Woldegeorgis
(74) *Attorney, Agent, or Firm*—Winston Hsu

(57) ABSTRACT

A redistribution connecting structure for solder balls is disclosed. A substrate includes a plurality of bonding pads. A plurality of dielectric layers, a redistribution conductive layer between the dielectric layer, and a plurality of solder balls are formed on the substrate. The redistribution layer has a redistribution pad disposed adjacent to one of the bonding pads without electrical connection with the redistribution pad. One of the dielectric layers covering the redistribution conductive layer has an opening to partially expose the redistribution pad, in which the opening is approximately circular and has a cut-off portion so that the opening is adjacent to an opening of another of the dielectric layers exposing one of the bonding pads without overlapping. Accordingly, bonding area of the redistribution pad for a bonding pad under one of the solder balls can be expanded to reduce stress effect.

9 Claims, 10 Drawing Sheets

REDISTRIBUTION CONNECTING STRUCTURE OF SOLDER BALLS

BACKGROUND OF THE INVENTION

1. Field of the Invention

The invention relates to a technique involving the connection of solder balls (i.e. solder bumps) for electronic devices, and more particularly, to a redistribution connecting structure for solder balls.

2. Description of the Prior Art

In the conventional art, solder balls are commonly disposed on the output terminal of electronic devices for connecting to other external devices. As the demand for product miniaturization increases, the position of solder balls must be rearranged and adjusted accordingly. As shown in FIG. 1, a conventional redistribution connecting structure 100 includes a substrate 110, a first dielectric layer 120, a redistribution conductive layer 130, a second dielectric layer 140, and a plurality of solder balls 150. A plurality of bonding pads 111 is disposed on the substrate 110, in which only one bonding pad is illustrated in the figure. The first dielectric layer 120 is disposed on the substrate 110 and exposes the bonding pad 111 through a plurality of openings. The redistribution conductive layer 130 is disposed on the first dielectric layer 120. One end of the redistribution conductive layer 130 is processed to form a plurality of redistribution pads 131 for adjusting the position of the solder balls 150. The second dielectric layer 140 is disposed on the first dielectric layer 120 and the redistribution conductive layer 130. Preferably, the second dielectric layer 140 includes a plurality of circular openings 141 to proportionally expose a portion of the redistribution pads 131. The solder balls 150 are disposed on the redistribution pads 131. A plurality of ball bases 160 is disposed under the solder balls 150, in which the ball bases 160 are connected to the redistribution pads 131 through the openings 141, thereby establishing a connection for the solder balls 150.

However, when the solder balls 150 are disposed too close to the bonding pads 111 having no electrical connection thereof, a stress will result and break the connection of the solder balls 150 and cause the solder balls to peel off. If the size of the opening 141 is reduced directly, the bonding area and the adhesive ability of the redistribution pads 131 and the ball bases 160 will decrease accordingly and result in the same problem. Currently, the position of the solder balls 150, hence the position of the opening 141 of the second dielectric layer 140, is formed away from the bonding pads 111 having no electrical connection thereof. This design ultimately limits the redistribution effect of the solder balls 150.

SUMMARY OF THE INVENTION

It is an objective of the present invention to provide a redistribution connecting structure to solve the aforementioned problem. According to the preferred embodiment of the present invention, a redistribution conductive layer is disposed between a first dielectric layer and a second dielectric layer on a substrate. The first dielectric layer partially exposes a plurality of bonding pads formed on the substrate, and the second dielectric layer partially exposes a plurality of redistribution pads formed on the redistribution conductive layer. Preferably, when a solder ball is disposed adjacent to a bonding pad having no electrical connection thereof and an opening of the first dielectric layer that exposes the bonding pad is covered by the surface of the solder ball, a substantially circular opening having a cut-off portion of the second dielectric layer is formed. Specifically, the opening of the second dielectric layer is formed adjacent to but not overlapping the opening of the first dielectric layer, thereby increasing the bonding area between the ball base and the redistribution pad and reducing the overall stress. Ultimately, phenomenon such as breaking or peeling of solder balls can be prevented, thus increasing the yield of the product.

According to an embodiment of the present invention, the redistribution connecting structure for solder balls includes a substrate, a first dielectric layer, a redistribution conductive layer, a second dielectric layer, at least a solder ball, and a first bonding pad and a second bonding pad disposed on the substrate. The first dielectric layer is disposed on the substrate, in which the first dielectric layer includes a first opening and a second opening partially exposing the first bonding pad and the second bonding pad. The redistribution conductive layer is formed on the first dielectric layer. The redistribution conductive layer includes a first redistribution pad and a second redistribution pad, in which the first redistribution pad is electrically connected to the first bonding pad through the first opening, and the second redistribution pad is electrically connected to the second bonding pad through the second opening. The second dielectric layer is formed on the first dielectric layer and the redistribution conductive layer. The second dielectric layer includes a third opening and a fourth opening, in which the third opening partially exposes the first redistribution pad and the fourth opening partially exposes the second redistribution pad. The solder ball is disposed on the first redistribution pad. The area of the solder ball preferably covers the third opening and a portion of the second opening. The third opening is substantially circular and disposed adjacent to but not overlapping the second opening, in which the third opening further includes a cut-off portion. By using this design, the solder ball can be disposed above the electrically insulated second bonding pad, thus reducing the overall stress and the eliminating the need for having additional redistribution conductive layers.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
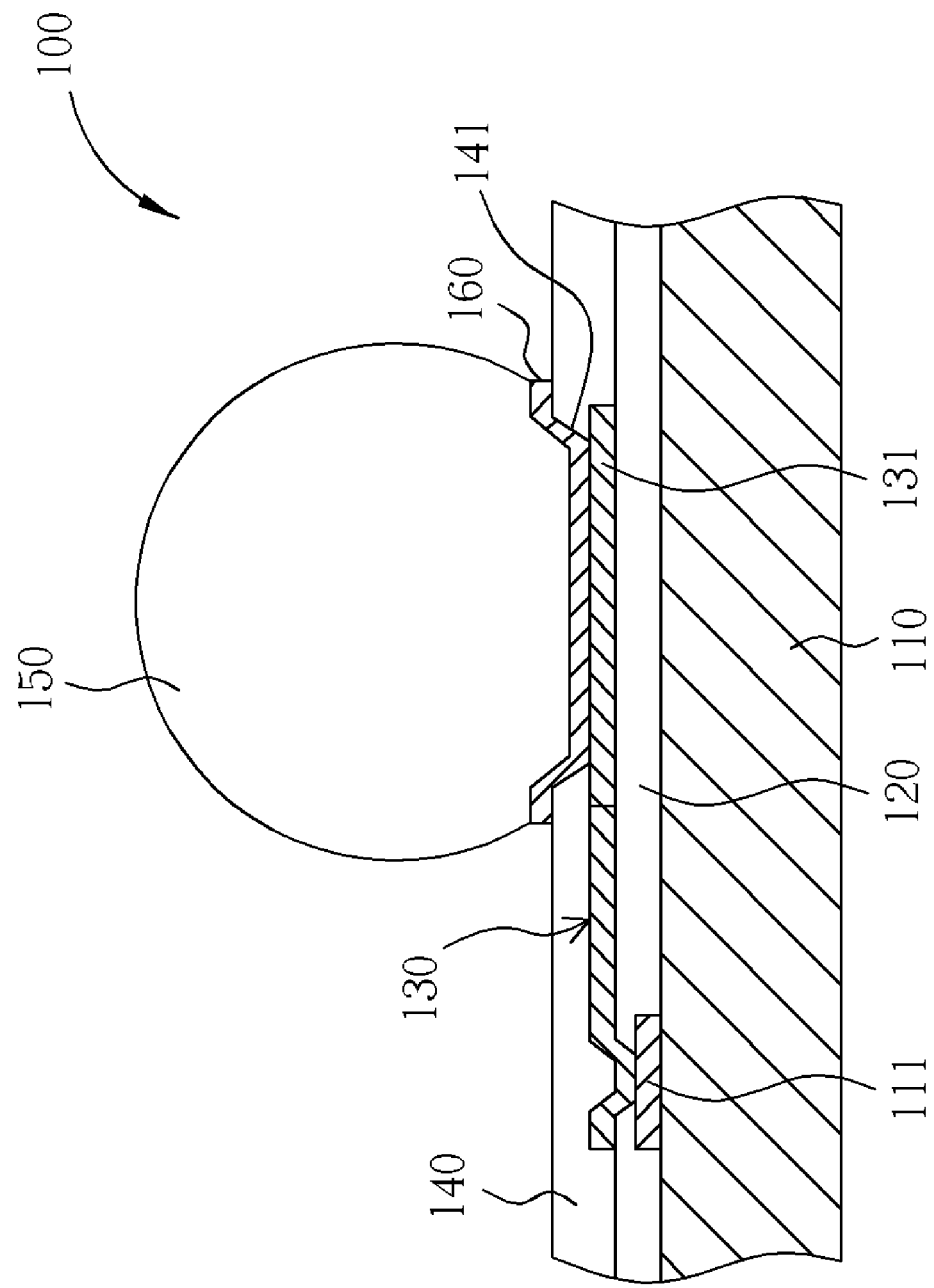
FIG. 1 illustrates a cross-section of a redistribution connecting structure for solder balls according to the prior art.
Figure 2A:
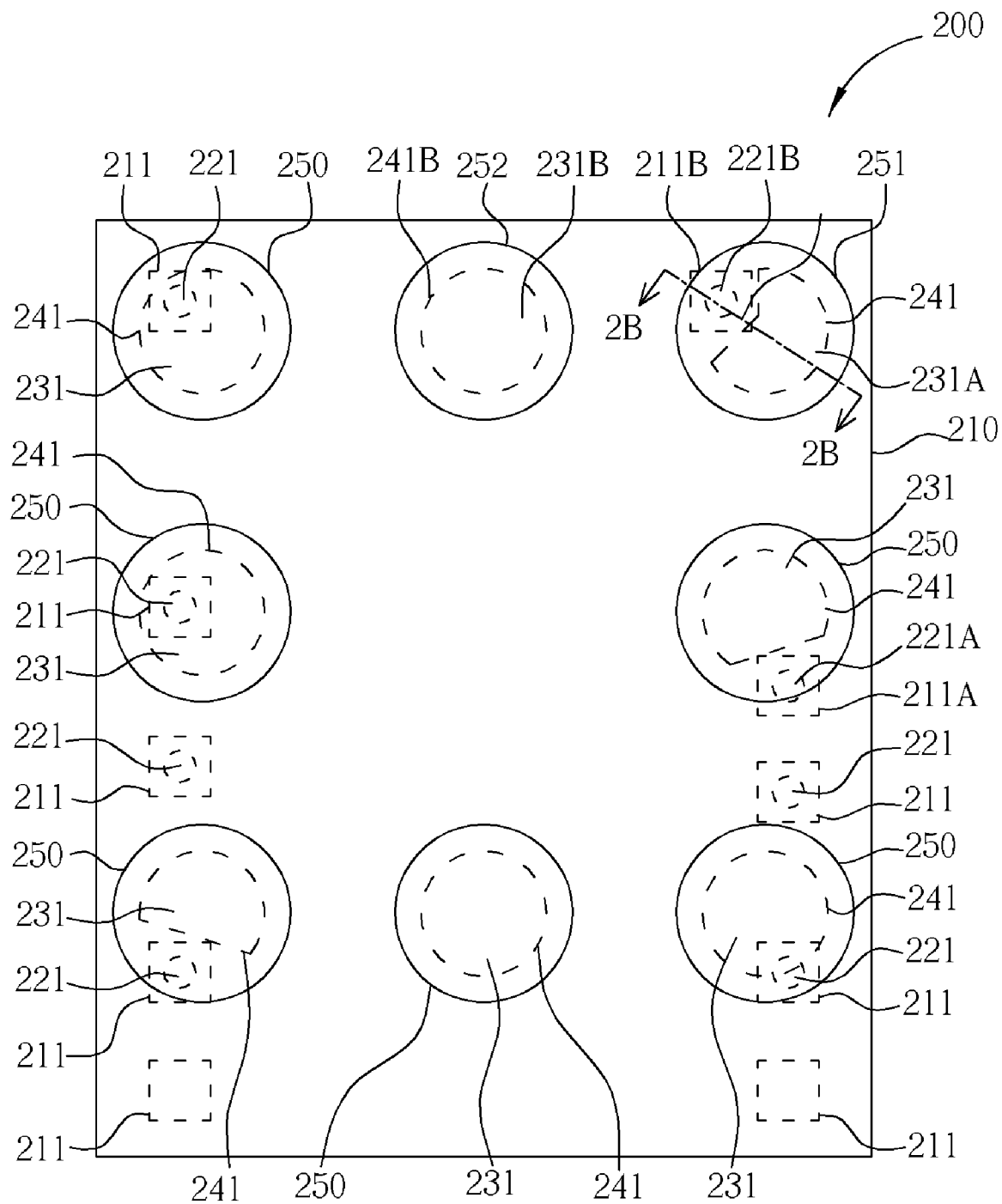
FIG. 2A illustrates a top-view of a redistribution connecting structure for solder balls according to the first embodiment of the present invention.
Figure 2B:
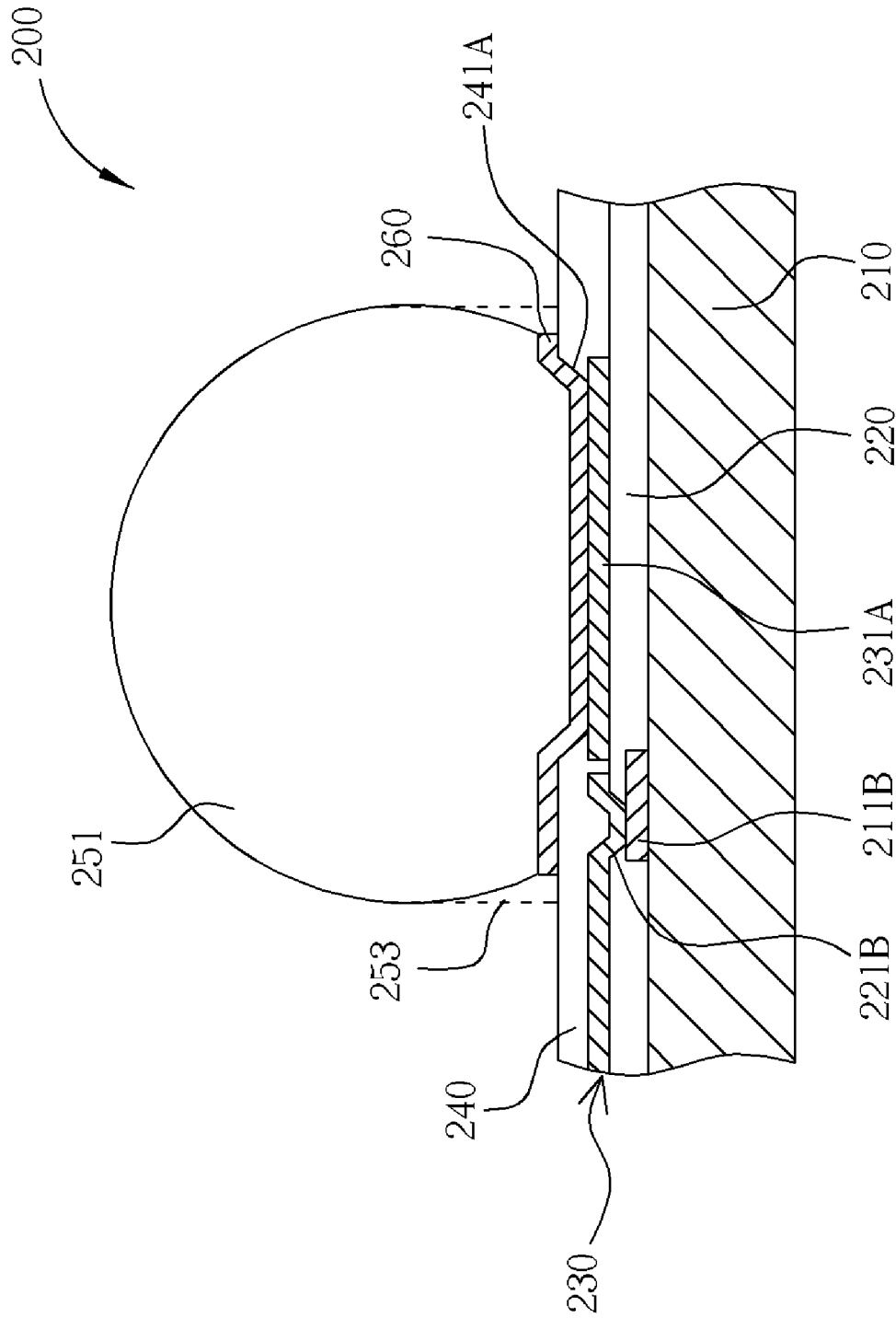
FIG. 2B illustrates a cross-section of the redistribution connecting structure of FIG. 2A along the sectional line 2B-2B.

FIG. 2A illustrates a top-view of a redistribution connecting structure 200 for solder balls (i.e. solder bumps) according to the first embodiment of the present invention. FIG. 2B illustrates a cross-section of the redistribution connecting structure 200 of FIG. 2A along the sectional line 2B-2B.

Figure 4A:
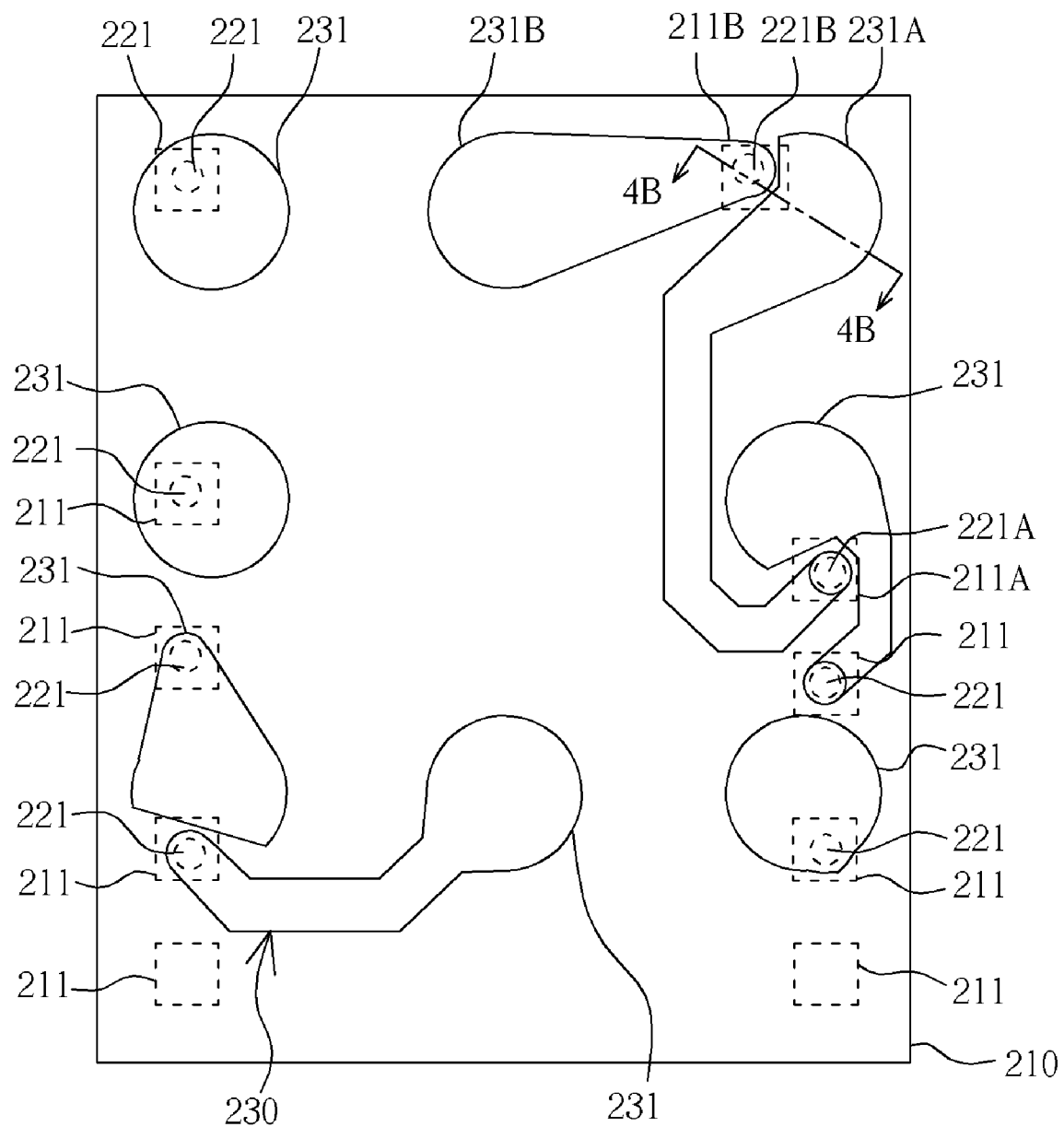

As shown in FIGS. 2A and 2B, the redistribution connecting structure 200 includes a substrate 210 having a plurality of bonding pads 211, a first dielectric layer 220, a redistribution conductive layer 230, a second dielectric layer 240, and a plurality of the solder balls 250. The solder balls 250 include at least a first solder ball 251 and a second solder ball 252, and the bonding pads 211 include a first bonding pad 211A and a second bonding pad 211B disposed on the substrate 210. The redistribution conductive layer 230 is used to electrically connect the first solder balls 251 and the first bonding pad 211A, and electrically connect the second solder ball 252 and the second bonding pad 211B, as shown in FIG. 2A and FIG. 4A. Preferably, the first solder ball 251 is disposed on the second bonding pad 211B and the first redistribution pad 231A of the redistribution conductive layer 230, and the second bonding pad 211B is electrically connected to the solder ball 251 without going through the redistribution conductive layer 230. The substrate 210 of the present embodiment is preferably an integrated circuit die, a ceramic substrate, a plastic substrate, a printed circuit board, or a flexible circuit board.

Figure 3A:
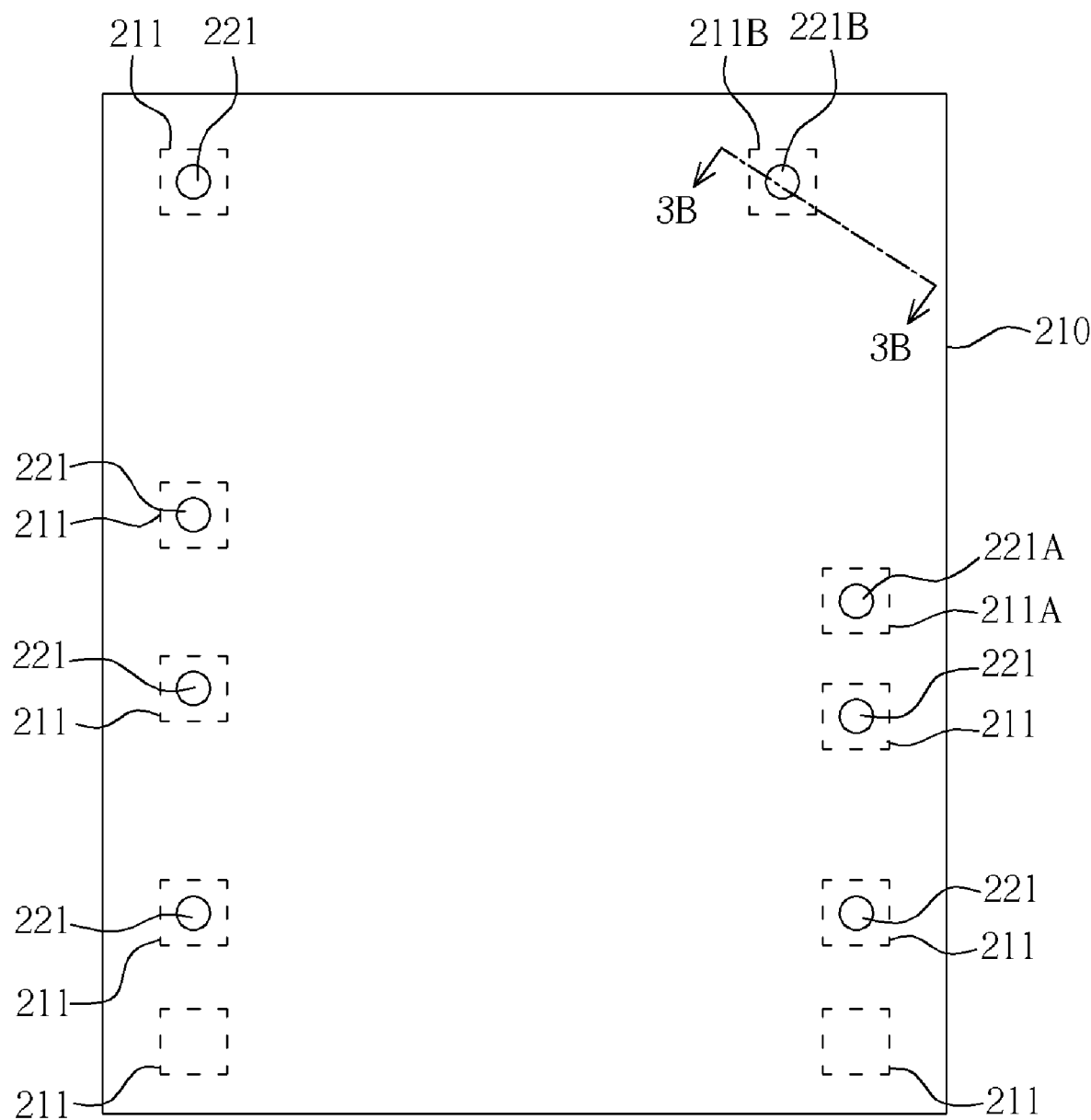
FIGS. 3A, 4A, and 5A illustrate a top-view of a redistribution connecting structure for solder balls during the fabrication process according to the first embodiment of the present invention.
Figure 3B:
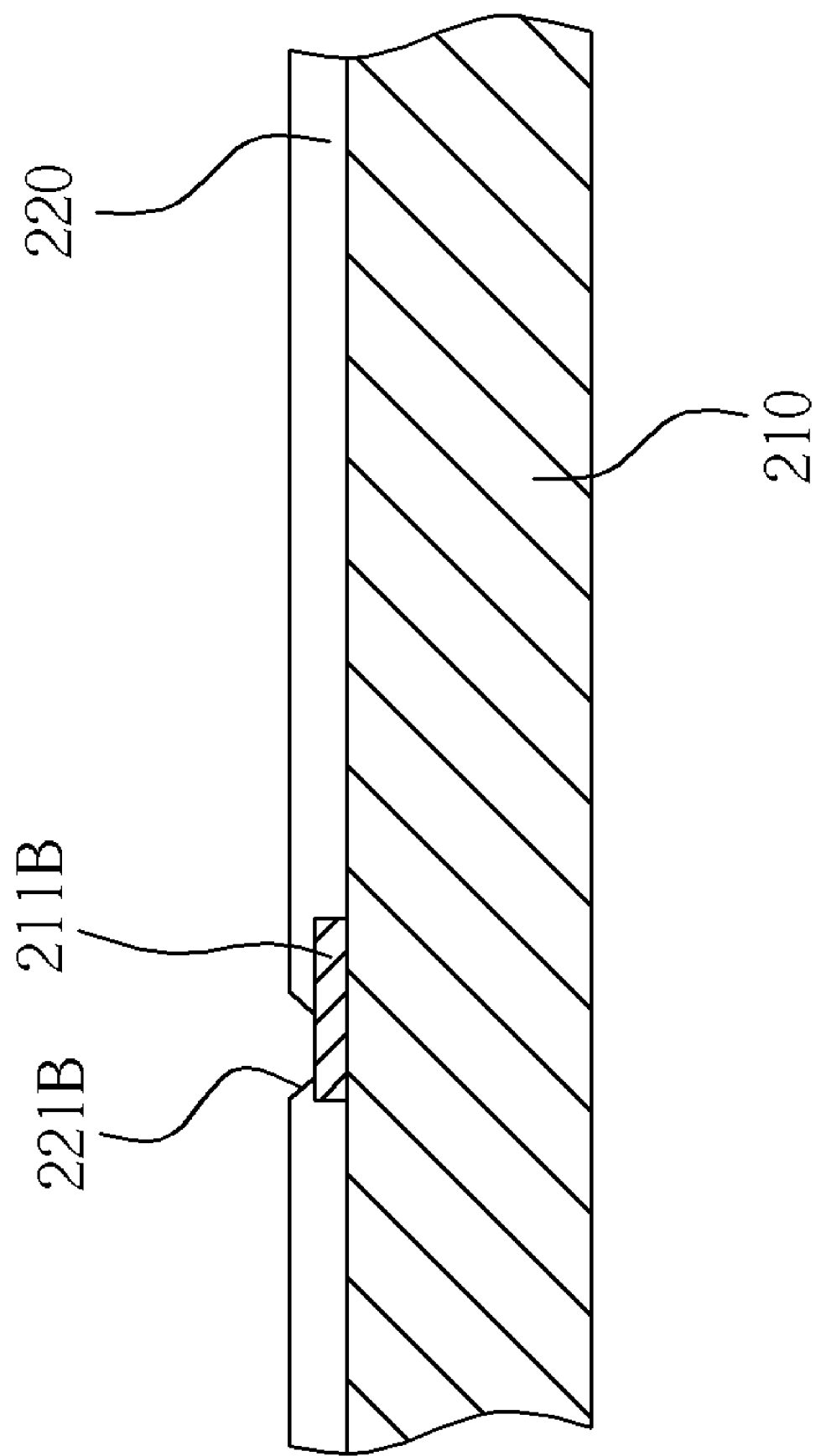
FIGS. 3B, 4B, and 5B illustrate a cross-section of a redistribution connecting structure for solder balls during the fabrication process according to the first embodiment of the present invention.

Please refer to FIG. 2B and FIGS. 3A and 3B. The first dielectric layer 220 is formed on the substrate 210, in which the first dielectric layer 220 includes a plurality of openings 221 for exposing the surface of the bonding pads 211. The openings 221 include a first opening 221A and a second opening 221B, in which the first opening 221A partially exposes the first bonding pad 211A and the second opening 221B partially exposes the second bonding pad 211B. In the present embodiment, the bonding pads 211, including the first bonding pad 211A and the second bonding pad 211B, are formed in a shape of a rectangle or a square. The openings 221, including the first opening 221A and the second opening 221B are formed in a shape of a circle. Preferably, the area of the openings 221 is smaller than the area of the bonding pads 211, and the first dielectric layer 220 is composed of phosphosilicate glass, polyimide, or benzocyclobutene.

Figure 4B:
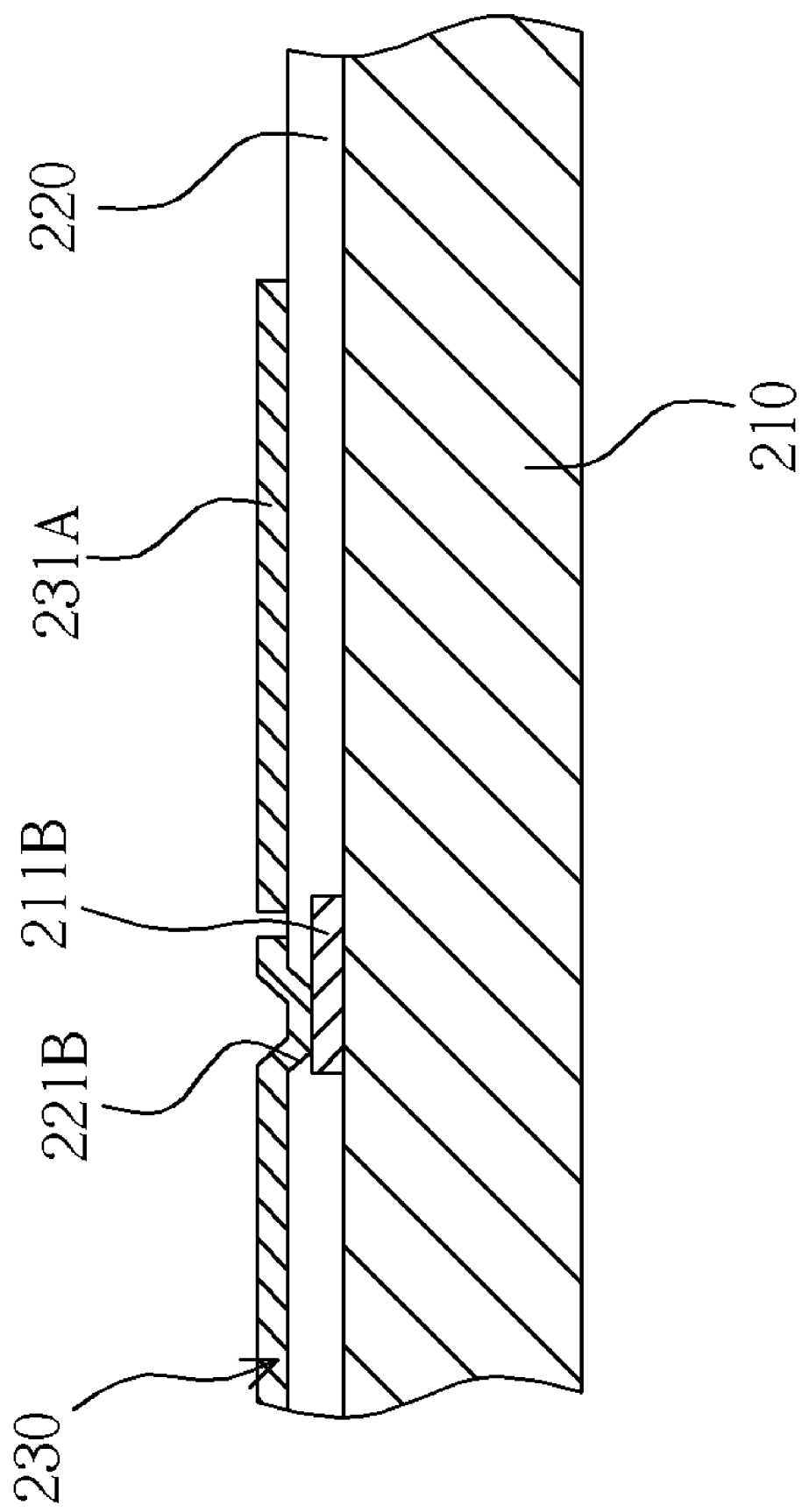

Please refer to FIG. 2B and FIGS. 4A and 4B. As shown in FIG. 2B and FIGS. 4A and 4B, the redistribution conductive layer 230 having a plurality of redistribution pads 231 is disposed above the first dielectric layer 220, in which the redistribution conductive layer 230 is electrically connected to the corresponding bonding pads 211 through the opening 221 of the first dielectric layer 220. The redistribution conductive layer 230 is preferably composed copper, aluminum, or other conductive metal. The redistribution pads 231 include a first redistribution pad 231A disposed on the upper right corner of FIG. 4A and a second redistribution pad 231B disposed on the upper corner of FIG. 4A. The first redistribution pad 231A is disposed adjacent to the second redistribution pad 211B and electrically connected to the first bonding pad 211A through the first opening 221A, and the second redistribution pad 231B is electrically connected to the second bonding pad 211B. In the present embodiment, the first redistribution pad 231A and the portion connecting the redistribution conductive layer 230 and the second bonding pad 211B are located adjacent to each other and in the same level, thus resulting in a non-perfect circular shape.

Figure 5A:
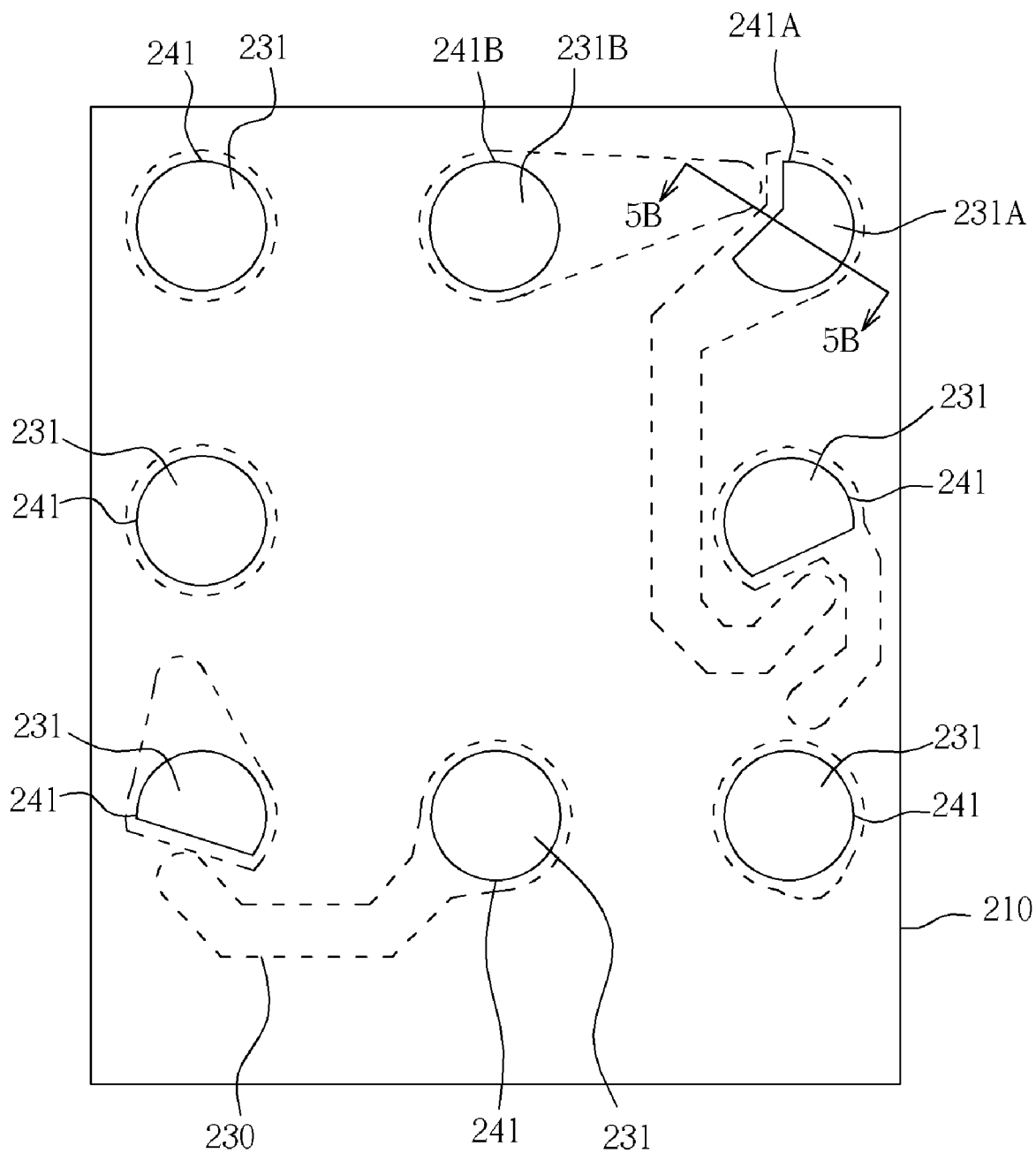
Figure 5B:
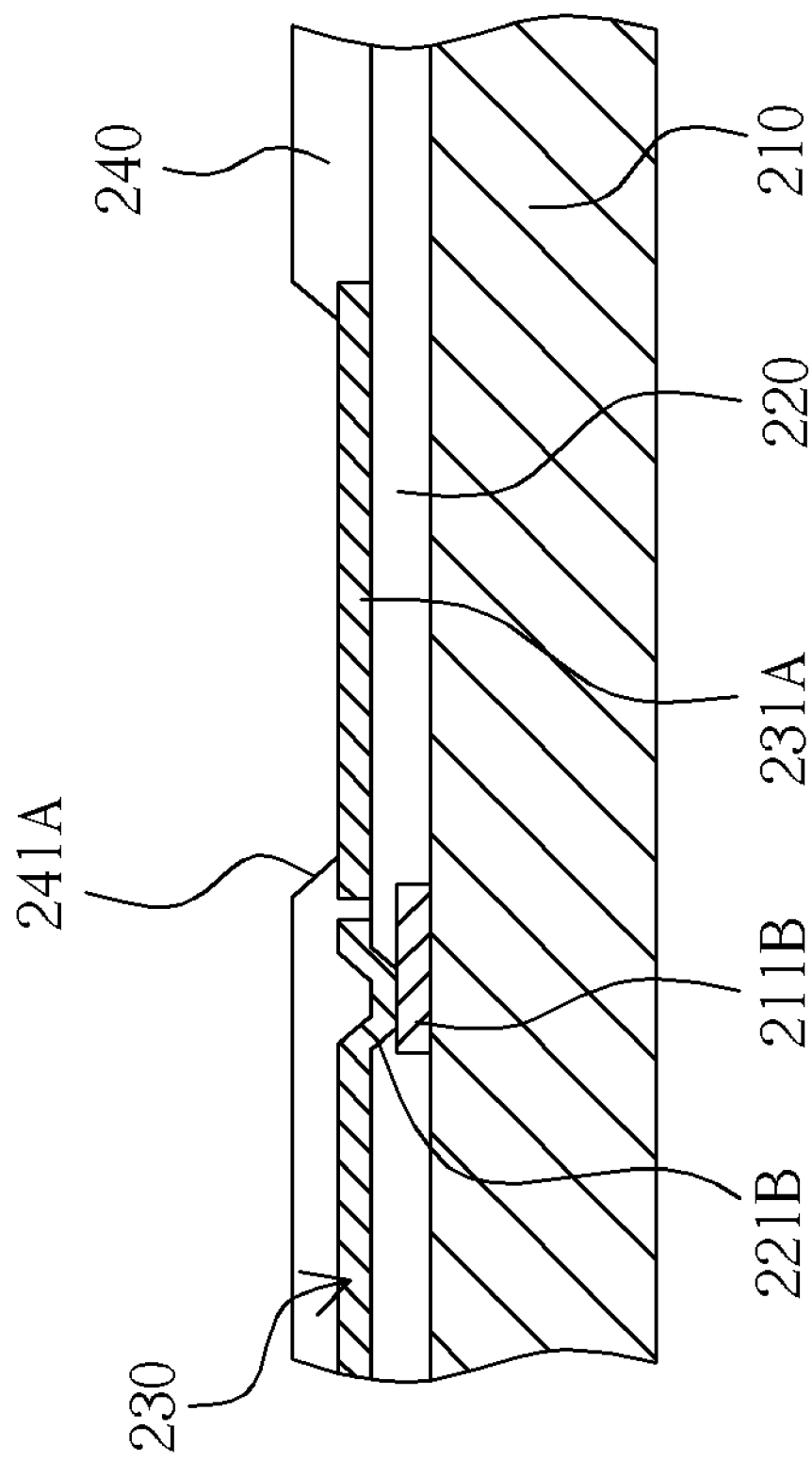

Please refer to FIG. 2B and FIGS. 5A and 5B. As shown in FIG. 2B and FIGS. 5A and 5B, the second dielectric layer 240 is disposed on the first dielectric layer 220 and the redistribution conductive layer 230, in which the second dielectric layer 240 includes a plurality of openings 241 for exposing the redistribution pads 231. In the present embodiment, the openings 241 include a third opening 241A and a fourth opening 241B, in which the third opening 241A partially exposes the first redistribution pad 231A and the fourth opening 241B partially exposes the second redistribution pad 231B. As shown in FIGS. 2A and 2B, the solder balls 250 are disposed on the redistribution pads 231, in which the first solder ball 251 is disposed on the first redistribution pad 231A and the second solder ball 252 is disposed on the second redistribution pad 231B. Preferably, the area 253 of the first solder ball 251 also covers the third opening 241A and a portion of the second opening 221B. Referring to FIGS. 5A and 5B, since the third opening 241A includes a substantially circular shape and a cut-off portion, the third opening 241A is formed adjacent to the second opening 221B but not overlapping the second opening 221B. In the present embodiment, the edge of the cut-off portion of the third opening 241A includes two straight lines for forming an included angle, thus resulting a substantially C-shaped third opening 241A. Additionally, as shown in the right region or lower left side of FIG. 5A, the edge of the cut-off portion of the openings 241 can be a straight line, thus forming a portion of the openings 241 into a substantially D shape.

As shown in FIG. 2A, the distance d between the edge of the second opening 221B and the center of the third opening 241A is less than the radius r of the third opening 241A. Hence, the third opening 241A of the second dielectric layer 240 that located in a relatively upper level, is not affected by the position of the second opening 221B of the first dielectric layer 220 that located in a relatively lower level, thereby providing adequate electrical barrier between the first redistribution pad 231A and the adjacent second bonding pad 211B and providing enough adhesion area for the first redistribution pad 231A.

The first solder ball 251 can be disposed above different second bonding pads 211B that are electrically insulated to each other, thus increasing the bonding area between the first redistribution pads 231A and the ball base 260 positioned under the solder ball 251 and eliminating the need for forming additional layers for the redistribution conductive layer 230. As shown in FIG. 2B, the redistribution connecting structure 200 also includes at least a ball base 260, in which the ball base 260 can be a conventional under bump metallurgy (UBM) structure composed of titanium/nickel-vanadium/copper, nickel/gold, nickel/copper, chromium/chromium-copper/copper. The ball base 260 is positioned on the redistribution pads 231 for connecting the solder balls 250. Additionally, the ball base 260 is substantially circular and disposed on the second dielectric layer 240, and the ball base 260 is connected to the first redistribution pad 231A through the third opening 241A. The ball base 260 is also extended to the top of the second opening 221B for adjusting the position of the solder ball 251, in which the area 253 of the solder ball covers the second opening 221B and at least a portion of the second bonding pad 211B.

Figure 6:
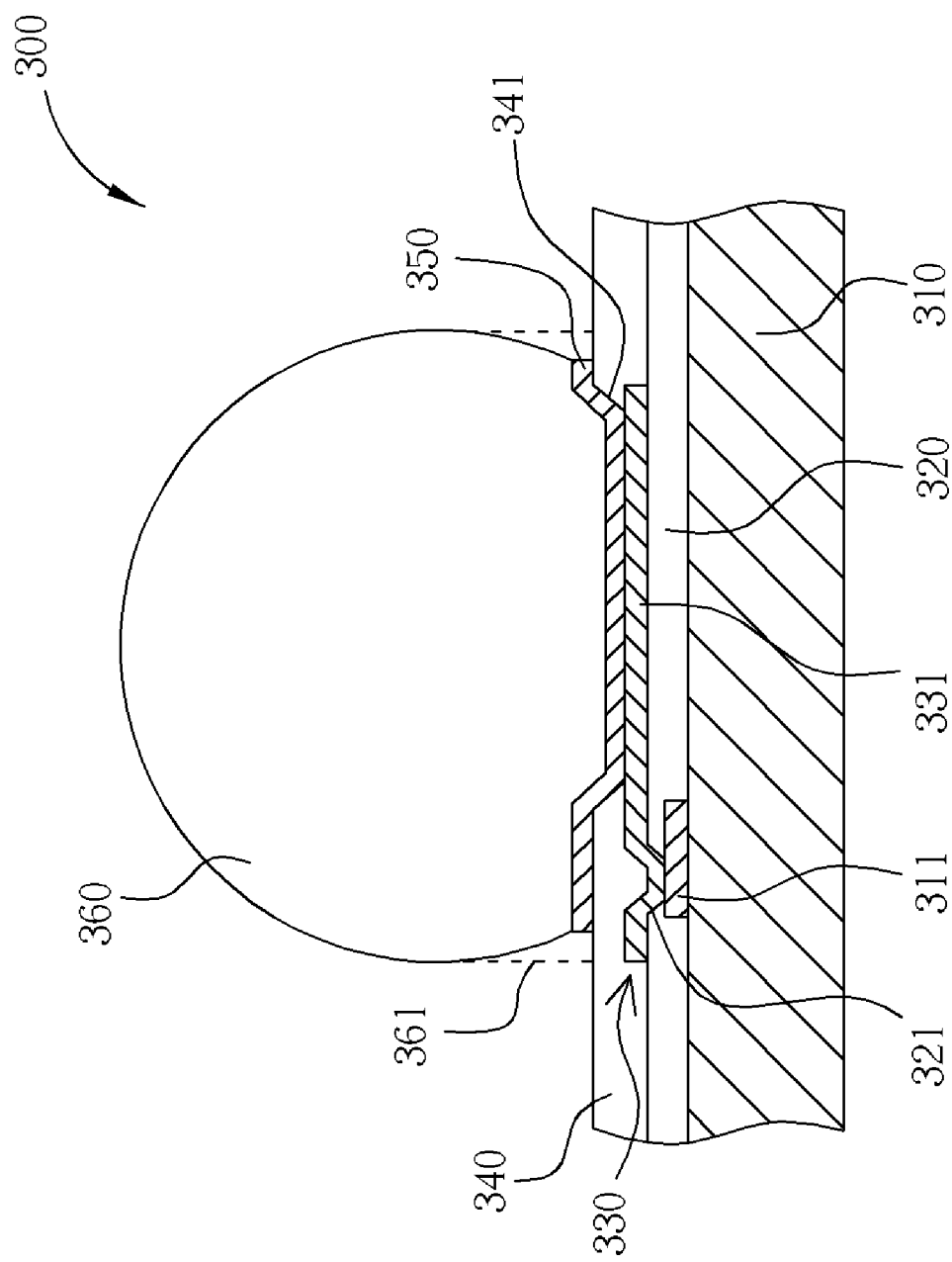
FIG. 6 illustrates a cross-section of a redistribution connecting structure for solder balls according to the second embodiment of the present invention.

The second embodiment of the present invention discloses another redistribution connecting structure for solder balls. As shown in FIG. 6, a redistribution connecting structure 300 for solder balls is provided. The redistribution connecting structure 300 includes at least a bonding pad 311 disposed on a substrate 310 of an integrated circuit chip. The substrate 310 includes a first dielectric layer 320 composed of phosphosilicate glass (PSG), silicon nitride, silicon dioxide, or polyimide thereon and an opening 321 for exposing the bonding pad 311. A redistribution conductive layer 330 composed of copper, aluminum, alloy thereof, or other composite metals is formed on the first dielectric layer 320. The redistribution conductive layer 330 includes at least a redistribution pad 331 disposed adjacent to the bonding pad 311 and electrically connected to the bonding pad 311 through the opening 321. The size of the redistribution pad 341 is preferably larger than the bonding pad 311. A second dielectric layer 340 (also refers to as a passivation layer) is disposed on the first dielectric layer 320 and the redistribution conductive layer 330. The second dielectric layer 340 includes a non-circular opening 341 for exposing the redistribution pad 331, in which the non-circular opening 341 is typically smaller than the redistribution pad 331. Additionally, at least a substantially circular ball base 350 (also refers to as an UMB pad) is disposed on the second dielectric layer 340, in which the ball base 350 is extended to the top of the opening 321 and connected to the redistribution pad 331 through the non-circular opening 341. The ball base 350 is composed of a plurality of metal layers, including an adhesion layer, a barrier layer, and a wetting layer. The ball base 350 includes at least a solder ball 360 thereon. Referring to FIG. 6, the area 361 of the solder ball 360 covers the non-circular opening 341 and the opening 321 of the first dielectric layer 320. The non-circular opening 341 includes a similar cut-off portion as described in the first embodiment, such that the non-circular opening 341 is adjacent but not overlapping the opening 321 of the first dielectric layer 320. In other words, the redistribution conductive layer 330 of the redistribution connecting structure 300 includes a redistribution pad 331 disposed adjacent to the bonding pad 311, such that the non-circular opening 341 of the second dielectric layer 340 that exposes the redistribution pad 331 can be used to increase the adhesion area of the ball base 350. By using the second dielectric layer 340 to cover the top portion of the opening 321, the thermal stress created with respect to the junction between the ball base 350 and the redistribution pad 331 is reduced significantly. Ultimately, the size and position of the ball barrier 350 can be adjusted accordingly, thereby preventing peeling or breakage of the solder ball 360 and increasing the yield of the product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A redistribution connecting structure for solder balls, comprising:
    a substrate;
    a first bonding pad and a second bonding pad disposed on the substrate;
    a first dielectric layer disposed on the substrate, wherein the first dielectric layer comprises a first opening and a second opening for exposing a portion of the first bonding pad and the second bonding pad respectively;
    a redistribution conductive layer having a first redistribution pad and a second redistribution pad disposed on the first dielectric layer, wherein the first redistribution pad is disposed adjacent to the second bonding pad and electrically connected to the first bonding pad through the first opening, and the second redistribution pad is electrically connected to the second bonding pad through the second opening;
    a second dielectric layer having a third opening and a fourth opening disposed on the first dielectric layer and the redistribution conductive layer, wherein the third opening exposes a portion of the first redistribution pad and the fourth opening exposes a portion of the second redistribution pad; and
    a first solder ball disposed on the first redistribution pad, wherein the surface of the first solder ball covers the third opening and a portion of the second opening, and the third opening is substantially circular and comprises a cut-off portion, such that the third opening is adjacent but not overlapping the second opening.

2. The redistribution connecting structure for solder balls of claim 1, wherein the distance between the edge of the second opening and the center of the third opening is less than the radius of the third opening.

3. The redistribution connecting structure for solder balls of claim 1 further comprising a ball base disposed on the second dielectric layer, wherein the ball base is substantially circular and connected to the first redistribution pad through the third opening.

4. The redistribution connecting structure for solder balls of claim 3, wherein the ball base is extended to the top of the second opening.

5. The redistribution connecting structure for solder balls of claim 1 further comprising a second solder ball disposed on the second redistribution pad.

6. The redistribution connecting structure for solder balls of claim 1, wherein the edge of the cut-off portion of the third opening comprises two straight lines forming an included angle, such that the third opening comprises a substantially C shape.

7. The redistribution connecting structure for solder balls of claim 1, wherein the edge of the cut-off portion of the third opening is a straight line, such that the third opening comprises a substantially D shape.

8. The redistribution connecting structure for solder balls of claim 1, wherein the substrate is an integrated circuit chip.

9. A redistribution connecting structure for solder balls, comprising:
    a substrate;
    a first bonding pad and a second bonding pad disposed on the substrate;
    a first dielectric layer disposed on the substrate, wherein the first dielectric layer comprises a first opening and a second opening for exposing a portion of the first bonding pad and the second bonding pad respectively;
    a redistribution conductive layer having a first redistribution pad and a second redistribution pad disposed on the first dielectric layer, wherein the first redistribution pad is disposed adjacent to the second bonding pad and electrically connected to the first bonding pad through the first opening, and the second redistribution pad is electrically connected to the second bonding pad through the second opening;
    a second dielectric layer having a third opening and a fourth opening disposed on the first dielectric layer and the redistribution conductive layer, wherein the third opening exposes a portion of the first redistribution pad and the fourth opening exposes a portion of the second redistribution pad; and
    a first solder ball disposed on the first redistribution pad, wherein the surface of the first solder ball covers the third opening and the second opening, and the third opening is substantially circular and comprises a cut-off portion, such that the third opening is adjacent but not overlapping the second opening.

* * * * *